United States Patent
Adut (10) Patent No.: US 7,514,997 B2
(45) Date of Patent: Apr. 7, 2009

(54) COMMON MODE REGULATION FOR THERMAL TAIL COMPENSATION

(75) Inventor: Jozef Adut, Nyack, NY (US)

(73) Assignee: LeCroy Corporation, Chestnut Ridge, NY (US)

( * ) Notice: Subject to any disclaimer, the term of this patent is extended or adjusted under 35 U.S.C. 154(b) by 109 days.

(21) Appl. No.: 11/518,765

(22) Filed: Sep. 11, 2006

(65) Prior Publication Data

US 2008/0061877 A1    Mar. 13, 2008

(51) Int. Cl.
H03F 3/45        (2006.01)
(52) U.S. Cl. .................... 330/256; 330/258; 330/297
(58) Field of Classification Search ................ 330/256, 330/258, 297
See application file for complete search history.

(56) References Cited

U.S. PATENT DOCUMENTS

| | | | |
|---|---|---|---|
| 3,659,117 A | 4/1972 | Caveney et al. | |
| 3,668,541 A | 6/1972 | Pease | |
| 4,528,516 A | 7/1985 | Hill, III | |
| 4,572,967 A | 2/1986 | Metz | |
| 4,755,766 A | 7/1988 | Metz | |
| 5,483,199 A | 1/1996 | Knudsen | |
| 5,977,832 A | 11/1999 | Satyanarayana et al. | |
| 6,107,882 A * | 8/2000 | Gabara et al. | 330/253 |
| 6,583,661 B1 * | 6/2003 | Tanji et al. | 327/355 |
| 6,636,098 B1 * | 10/2003 | Kizer | 327/345 |
| 6,784,746 B1 | 8/2004 | Wuppermann | |
| 6,815,988 B2 * | 11/2004 | Sanduleanu | 327/157 |
| 7,068,103 B2 * | 6/2006 | Lind | 330/251 |
| 7,233,204 B2 * | 6/2007 | Kim et al. | 330/260 |
| 2005/0035821 A1 | 2/2005 | Everton et al. | |

* cited by examiner

Primary Examiner—Patricia Nguyen
(74) Attorney, Agent, or Firm—Gordon Kessler (57) ABSTRACT

A waveform processing system, and associated methods and apparatus, may include a common mode feedback compensation circuit to adjust a voltage supplied to a differential circuit so as to substantially reduce or eliminate signal distortion associated with thermal tails. In an illustrative example, a feedback circuit may control a supply voltage to maintain a common mode voltage at the collectors of the input transistors of a differential amplifier. For example, the feedback may compensate for component tolerances and/or temperature changes that may cause the cause the input transistors to operate away from a nominal constant power operating point. In some embodiments, the differential circuit and common mode feedback compensation circuit may be configured to substantially reduce thermal tail effects by controlling the supply voltage to maintain a substantially constant power condition for the input transistors.

17 Claims, 7 Drawing Sheets

COMMON MODE REGULATION FOR THERMAL TAIL COMPENSATION

TECHNICAL FIELD

Various embodiments relate to thermal tail compensation of transistors in differential circuits.

BACKGROUND

Oscilloscopes are tools that engineers often use to measure signals from electronic devices. Oscilloscopes may be used to view analog or digital waveforms in a circuit, for example. Circuit signals may be tapped using voltage or current probes that are coupled to an oscilloscope.

When received at an oscilloscope input, a waveform is typically conditioned by various filters and amplifiers. In a typical digital oscilloscope, the waveform is sampled and converted to a digital representation, and then either displayed or stored in a memory device.

Prior to conversion from an analog waveform to a digital representation, input signals may be, for example, buffered, amplified, and/or level shifted by signal conditioning circuitry. Some signal conditioning circuits may have a relatively high impedance input to minimize loading of the input signal. After being conditioned, the input signal may be sampled. For example, a track and hold circuit may be used to sample a signal by capturing a signal voltage on a capacitor.

Achieving high bandwidth in a digital oscilloscope generally involves fast sampling. Accordingly, some signal conditioning circuits may include transistor circuits to facilitate rapid charging of a capacitor in the sampling circuit.

At certain signal frequencies, transistor circuits can exhibit a significant "thermal tail" effect due to temperature changes that may result from changes in the power dissipation. In the signal conditioning circuitry of a digital oscilloscope, for example, thermal tail effects can distort some signals before the signals are sampled. As such, thermal tails can result in sampled waveforms that include a thermal tail component in addition to features of the original input signal waveform.

SUMMARY

A waveform processing system, and associated methods and apparatus, may include a common mode feedback compensation circuit to adjust a voltage supplied to a differential circuit so as to substantially reduce or eliminate signal distortion associated with thermal tails. In an illustrative example, a feedback circuit may control a supply voltage to maintain a common mode voltage at the collectors of the input transistors of a differential amplifier. For example, the feedback may compensate for component tolerances and/or temperature changes that may cause the cause the input transistors to operate away from a nominal constant power operating point. In some embodiments, the differential circuit and common mode feedback compensation circuit may be configured to substantially reduce thermal tail effects by controlling the supply voltage to maintain a substantially constant power condition for the input transistors.

Some embodiments may have one or more advantages. For example, various embodiments may provide improved transient response, which may include robust performance and signal fidelity around frequencies at which thermal tail effects are significant. Various implementations may provide thermal tail compensation over a wide range of operating temperature and supply voltages. Moreover, various implementations may provide robust thermal tail compensation for circuits having a range of parameters due to variability in semiconductor fabrication processing.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION OF ILLUSTRATIVE EXAMPLES

Figure 1:
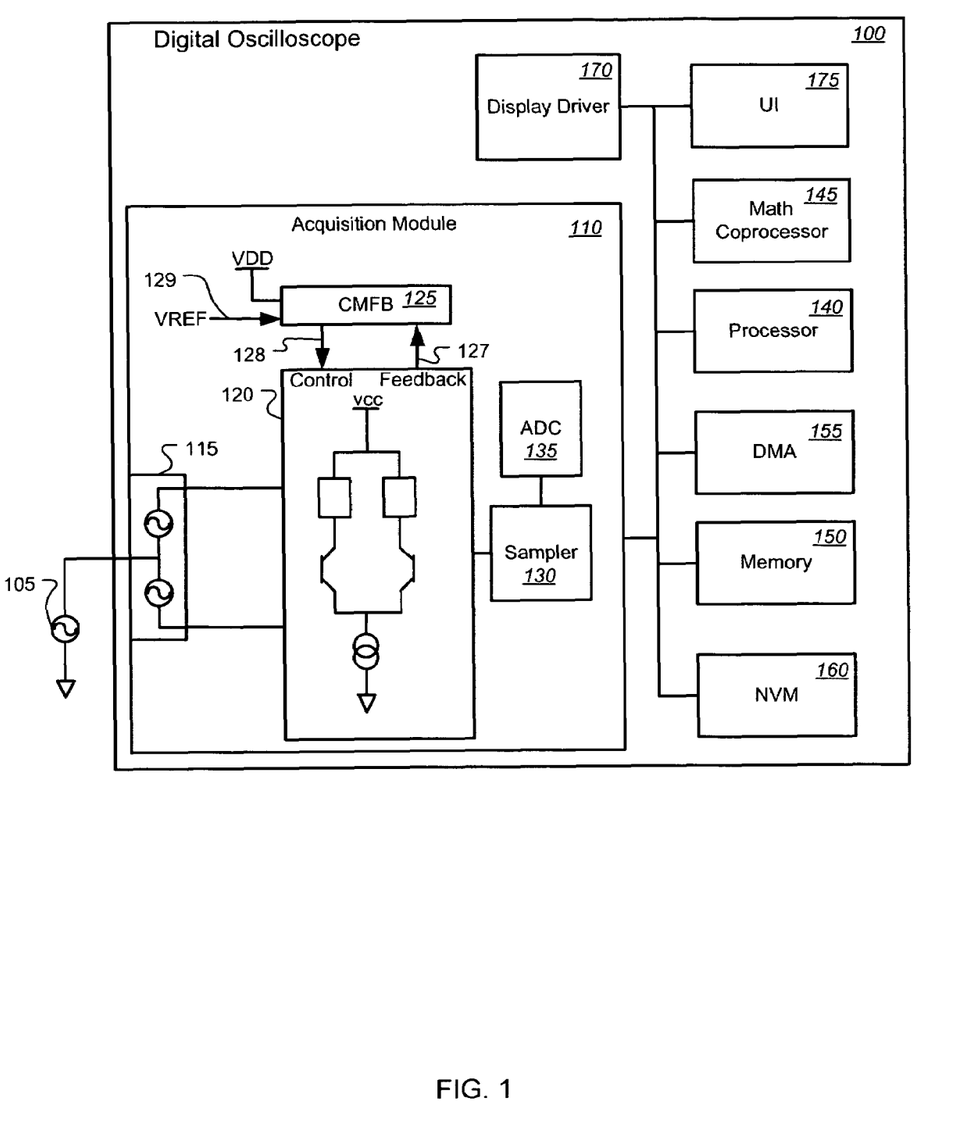
FIG. 1 illustrates an exemplary digital oscilloscope that includes a differential amplifier with common mode voltage regulation.

FIG. 1 shows an exemplary digital oscilloscope 100 that is capable of acquiring and processing waveforms, such as analog signals from an external source 105. Upon acquisition, the signal is processed by an acquisition module 110, which includes an input module 115 that converts a single ended input signal into a differential signal. For example, the external source 105 may be a probe for measuring a voltage in a circuit device under test. The acquisition module 110 further includes a differential amplifier 120 and a common mode feedback (CMFB) circuit 125 to substantially regulate a common mode voltage associated with the differential amplifier 120. In some implementations, the CMFB circuit 125 may operate to maintain a common mode portion of the differential amplifier output voltage substantially near a desired operating point. For example, the CMFB circuit 125 may maintain a common mode voltage so as to substantially reduce thermal tail effects for input transistors of the differential amplifier 120, and such improvement may be exhibited over a wide range of operating parameters (e.g., supply voltage, temperature). Accordingly, common mode feedback regulation may be used to improve performance of the digital oscilloscope 100.

In the depicted acquisition module 110, the differential amplifier 120 amplifies a differential signal received from the input module 115. The differential amplifier 120 amplifies the difference between two input signals by some gain to produce an output signal.

The acquisition module 110 includes the CMFB circuit 125. In one embodiment, the CMFB circuit 125 generates a control signal 128 by amplifying a difference between a feedback signal 127 in the differential amplifier 120 and a reference voltage 129 (VREF). The CMFB circuit 125 transmits the control signal 128 to the differential amplifier 120. The CMFB 125 may modulate the control signal 128 to maintain a substantially constant operating condition in the differential amplifier 120. In one embodiment, the control signal 128 controls a voltage and/or current source supplied to operate the differential amplifier 120 so that power dissipation in each of the input transistors of the differential amplifier remains at a substantially constant level.

The acquisition module 110 also includes a sampling circuit 130 and an analog-to-digital converter (ADC) 135. In one embodiment, the sampling circuit 130 includes a track-and-hold that tracks an input voltage in one state and holds the tracked voltage in another state. For example, the sampling circuit 130 may track and hold the output voltage of the differential amplifier 120 according to a trigger signal. In some embodiments, a sample and hold circuit may be used with, or in place of, the track and hold circuit 130.

The ADC 135 reads the voltage signal held in the sampling circuit 130, and generates a digital representation of the amplitude of the held voltage signal. The digital representation includes a digitally-encoded value that can be digitally processed and/or stored. For example, the sampler circuit 130 and the ADC 135 may cooperate to digitize an input signal waveform by sampling and converting the amplitude of an input signal to a digital representation at each of a number of sample times.

In the acquisition module 110, the control signal 128 may regulate an operating point for each of the differential input transistors in the differential amplifier 120 such that each of the differential input transistors operates at a substantially constant power over a range of operating conditions. Such operating conditions may relate to semiconductor process variations, supply voltage variations, and/or temperature conditions. For example, voltage conditions may include an external supply that varies between about −10% to +300%, or a regulated supply voltage for an integrated circuit which may vary up to at least +/−10% from a nominal voltage, and may further include up to at least about 15% voltage ripple, such as up to about 5% or 10% voltage ripple. In some examples, temperature conditions may include operating in ambient (e.g. air) that is between about −40 to about 150 degrees Celsius, such as between about 0 to 100 or about 20 to 80 degrees Celsius. In some further examples, semiconductor process variations may include, for example, effects associated with non-uniform doping profiles, such as integrated resistor values with up to at least +/−20% tolerances, and/or variations in base-emitter voltage characteristics.

In some embodiments, the CMFB circuit 125 may modulate the control signal 128 to substantially mitigate thermal tail effects in the differential amplifier 120 over a wide range of variations in semiconductor process parameters, power supply voltages, and/or temperature conditions, for example.

Thermal tail effects may result, for example, from transistor temperature changes that correspond to changes in power dissipation levels in the transistor. A change in power dissipation may cause changes in the transient response of the transistors in the differential amplifier 120, leading to transient errors in the output signal. In some embodiments, the differential amplifier 120 may be designed to operate substantially near a constant power point to substantially reduce thermal tail effects. However, the operating point of the differential amplifier 120 may deviate from the designed operating point due, for example, to variations in process parameters (e.g., due to tolerances of load and degeneration resistance values, doping and thickness variations in the transistors, etc.), temperature variations, and/or supply voltage.

The CMFB 125 may substantially maintain an operating condition of the differential amplifier 120 using the feedback signal 127. In some examples, the feedback signal 127 may represent an average of the output differential signal. The CMFB circuit 125 may control a power supply of the differential amplifier 120 to maintain a desired operating condition in the differential amplifier 120. Examples of differential amplifying circuits using the differential amplifier 120 and the CMFB circuit 125 are described in additional detail with reference to FIGS. 2-7.

The oscilloscope 100 of this example also includes a processor 140 and a math coprocessor 145. The processor 140 and/or coprocessor 145 may perform various functions, such as supervisory, user interface, signal processing, and signal analysis, in support of the digital oscilloscope 100 operations. For example, the processor 140 may supervise various operations, such as waveform data collection and user interaction. The math coprocessor 145 may include one or more of the following: an ASIC (application specific integrated circuit), DSP (digital signal processor), discrete or integrated analog and/or digital circuits, and a dedicated digital logic architecture to perform mathematics functions, for example. The math coprocessor 145 may cooperate with the processor 140 to perform various functions. For example, the math coprocessor 145 may perform operations that include floating point arithmetic, signal processing, digital filtering (e.g., IIR, FIR) and/or numerical operations (e.g., curve fitting, numerical derivative computation, numerical integration, fast Fourier transformation (FFT), and interpolation).

In this example, the processor 140 is coupled through a digital bus to memory devices, including a memory 150, a Direct Memory Access (DMA) controller 155, and a non-volatile memory (NVM) 160. The NVM 160 may provide a storage space for storing data (e.g., sampled waveform data acquired by the acquisition module 110) and/or executable instructions (e.g., application software). NVM 160 may include, for example, flash memory, read only memory (ROM), EEPROM, data storage devices with rotating media (e.g., optical or magnetic disc drive), tape storage devices, or any combination of such devices. The memory 150 may provide temporary storage for the sampled signal data from the acquisition module 110. The memory 150 may include, for example, RAM, a buffer, or cache memory, which may provide volatile data storage. For example, the memory 150 may store the data for an eye diagram generated from a repetitive bit pattern, and store a corresponding persistence map that provides data for each bit interval in the pattern. The DMA 155 may handle accesses of the memory 150 without direct involvement of the processors 140, 145. For example, the DMA 155 can move data from one memory location to another memory location. In another example, the DMA 155 may be configured to move samples of the input signal from the acquisition module 110 directly into sequential memory locations, such as an array in the memory 150 and/or the NVM 160, for subsequent signal analysis.

In this example, the NVM 160 is coupled to the processor 140 by a digital address/data bus. The processor 140 may execute instructions and retrieve information stored in the NVM 160 via the bus. The NVM 160 may include a number of code modules (not shown) to perform measurement operations, including operations in support of basic digital oscilloscope operations (e.g., user interface, boot-up, configurations, etc.).

The digital oscilloscope 100 also includes a display driver 170 and a user interface (UI) 175. The display driver 170 may format and send images for display on a display device (not shown) in the UI 175. For example, the display driver 170 can send for display overlapping samples of a waveform received from the input module 115. The UI 175 may include one or more input devices (e.g., keyboard, keypad, soft menus, dials, buttons, touch screen, mouse, etc.) and one or more output devices (e.g., display screen, printer port, audio outputs, indicator lights, etc.). An operator can operate the UI 175 to input commands and/or information to set-up and/or control operation of the digital oscilloscope 100.

Figure 2:
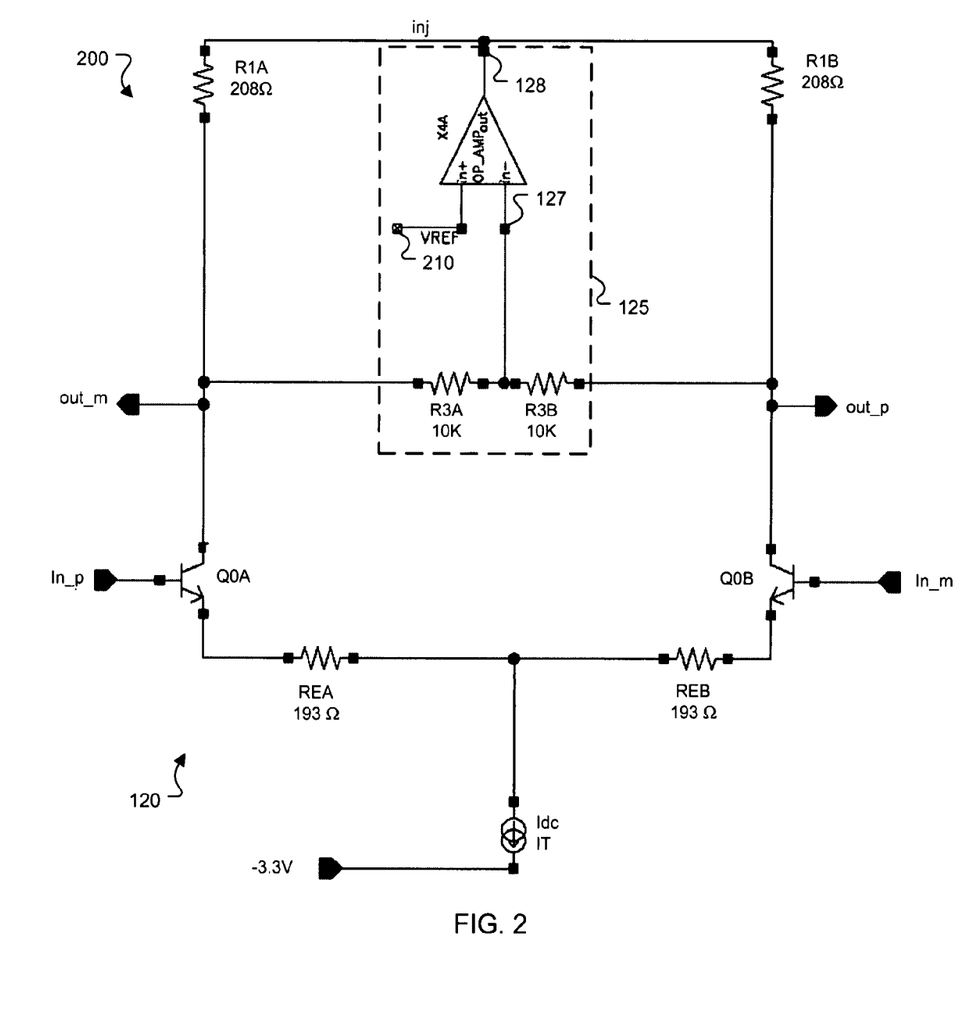
FIGS. 2-5 illustrate schematics of exemplary differential amplifiers with common mode voltage regulation.

FIG. 2 shows a schematic of an exemplary circuit 200 that shows embodiments of the differential amplifier 120 and the CMFB circuit 125 in additional detail. In this example, the differential amplifier 120 includes two differential inputs in_p and in_m, two transistors Q0A and Q0B, two resistors R1A and R1B, two degeneration resistors REA and REB, and two differential outputs output_m and output_p. The differential amplifier 120 also includes a current source Idc. The resistors R1A and R1B are each connected to a voltage supply node inj.

In an illustrative example, the resistors R1A and R1B may each have a nominal resistance of about 208 Ohms, and the resistors REA and REB may each have a nominal resistance of about 193 Ohms. In other examples, different resistance values may be used to achieve the desired operating point. In this example, the current source Idc is driving a current of IT. If, for example, the differential input signal applied to in_p, in_m is substantially zero, then IT divides substantially equally between the R1A, Q0A, REA branch (the "A-branch") and the R1B, Q0B, REB branch (the "B-branch").

In various embodiments, the differential circuit may be designed to operate substantially at a constant power operating point for each of the transistors Q0A, Q0B. In some preferred embodiments, the circuit parameters are selected to substantially provide a nominal operating point at which the combined voltage drop across the resistors R1A, REA is substantially equal to the collector-to-emitter voltage across Q0A, and at which the combined voltage drop across the resistors R1B, REB is substantially equal to the collector-to-emitter voltage across Q0B.

For suitable selections of the resistance values and the value of the current It, the transistors Q0A, Q0B may be maintained near a substantially constant power operating condition by controlling a voltage (Vinj) at the voltage supply node inj. Suitable selections of resistance values for R1A, R1B, REA, and REB, and current for Idc may be selected to set a nominal operating point for the circuit at which a combined voltage drop across the resistances in the A-branch and B-branch is substantially equal to the collector-to-emitter voltage across the corresponding transistor Q0A and Q0B.

Despite careful selection of nominal values, the operating point of the transistors Q0A, Q0B may deviate from their respective constant power operating points for a variety of reasons. For example, the component values R1A, R1B, REA, and REB, and the current source Idc may have non-zero parameter tolerances (e.g., from less than about 1% to at least about 30% absolute accuracy, or about +/−20%), and/or non-ideal temperature characteristics. Accordingly, resistor values may not be sufficiently matched, and voltage or current levels may deviate from nominal operating points. Achieving sufficiently accurate component values to mitigate thermal tails may significantly increase device cost.

Moreover, current and voltage characteristics in various components of the circuit 120 may change over temperature. For example, the resistors and current source may have significant temperature coefficients. The voltage drops across the transistors Q0A, Q0B may also change, for example, at a rate of about 1.6 mV/° C.

Such non-idealities can permit variations in power dissipation in either or both of the transistors Q0A, Q0B. Variations in power dissipation may reduce the effectiveness of the thermal tail compensation. As a result, some thermal tail effects may cause the oscilloscope 100 to display transients that are artifacts of the changing temperature of the transistors Q0A, Q0B rather than features of the input signal.

For embodiments in which nominal combined voltage drop across the resistances (e.g., R1A and REA) in a branch (e.g., A-Branch) is substantially equal to the nominal voltage drop across the transistor in that branch (e.g., Q0A), the branch transistor may be operated substantially at a constant power operating point by controlling the voltage $V_{inj}$ at the voltage supply node inj. In particular embodiments, the voltage $V_{inj}$ at the voltage supply node inj may be controlled to substantially maintain a common mode voltage between the A-branch and the B-branch of the differential amplifier 120.

In the example depicted in FIG. 2, common mode voltage regulation between the A-branch and the B-branch is provided by the CMFB circuit 125. The CMFB circuit 125 includes an operational amplifier X4A and two common mode sense resistors R3A, R3B connected in series between the A-branch and the B-branch. The sense resistors R3A, R3B may be used for detecting a common mode voltage in the differential circuit.

The X4A has an inverting input and a non-inverting input. The inverting input is connected to a common mode node 127, and the non-inverting input is connected to a voltage reference (VREF) node 210. The X4A amplifies the difference between the signals at the nodes 127, 210 to generate a control output 128 that is connected to the voltage supply node inj.

The inverting input is connected to the common mode node 127, which is the common junction of the common mode sense resistors R3A, R3B. The resistors R3A, R3B are each connected from the common mode node 127 to respective collectors of the transistors Q0A, Q0B. The resistance value of each of the resistors R3A, R3B may be substantially equal. As such, the voltage at the common mode node 127 represents a common mode signal of the output of the differential amplifier 120. In some embodiments, filter elements (e.g., resistor-capacitor networks) may be provided (e.g., in series and/or parallel) with the common mode sense resistors R3A, R3B to provide a desired frequency response over one or more frequency ranges. In some implementations, filter elements may be used to compensate the common-mode feedback amplifier response.

In some embodiments, the resistances R3A, R3B may each be approximately 10 kOhm, for example, or otherwise high enough (e.g., relative to the resistors R1A, R1B) not to significantly load the output signal (e.g., out_p-out_m). In some embodiments, a high input impedance element, such as a BJT (bipolar junction transistor) configured as an emitter follower with a collector connected to a supply node, or a JFET (junction field effect transistor) configured as a source follower with a drain connected to a supply node, may be used to reduce loading of the output signal. The supply node may be, for example, the supply node inj or an available fixed voltage supply node.

The non-inverting input of the X4A is connected to a voltage reference (VREF) node 210. In some embodiments, the voltage VREF may be controlled by a control circuit or a controller, which may include a processor executing a program of instructions stored in a data store. For example, a controller may be used to control the voltage VREF to change the response or operating condition of the differential amplifier 120. Various sources may be used to generate VREF, including fixed, adjustable, and/or controllable sources. Such sources may include, but are not limited to, bandgap references, laser-trimmed voltage references, pulse-width modulated voltage sources, sources generated by a digital-to-analog converter (DAC), potentiometer-controlled voltages, resistor divider networks, and linear regulators.

In the circuit 200, the CMFB circuit 125 can maintain a substantially constant common mode voltage at the collectors of the transistors Q0A, Q0B. For example, the CMFB circuit 125 may maintain an average of the collector voltages of Q0A and Q0B substantially close to VREF. Accordingly, the CMFB circuit 125 may substantially compensate for drift or deviation of the operating point due to variation in process, supply voltage, and/or temperature, which can result in thermal tail effects in the transistors Q0A, Q0B. The CMFB circuit 125 may detect the drift in the operating condition and maintain the differential amplifier 120 in constant power mode by varying $V_{inj}$. In some examples, the CMFB circuit 125 can also stabilize common mode output signals and/or increase insensitivity of the response of the differential amplifier 120 to power supply variations.

Figure 3:
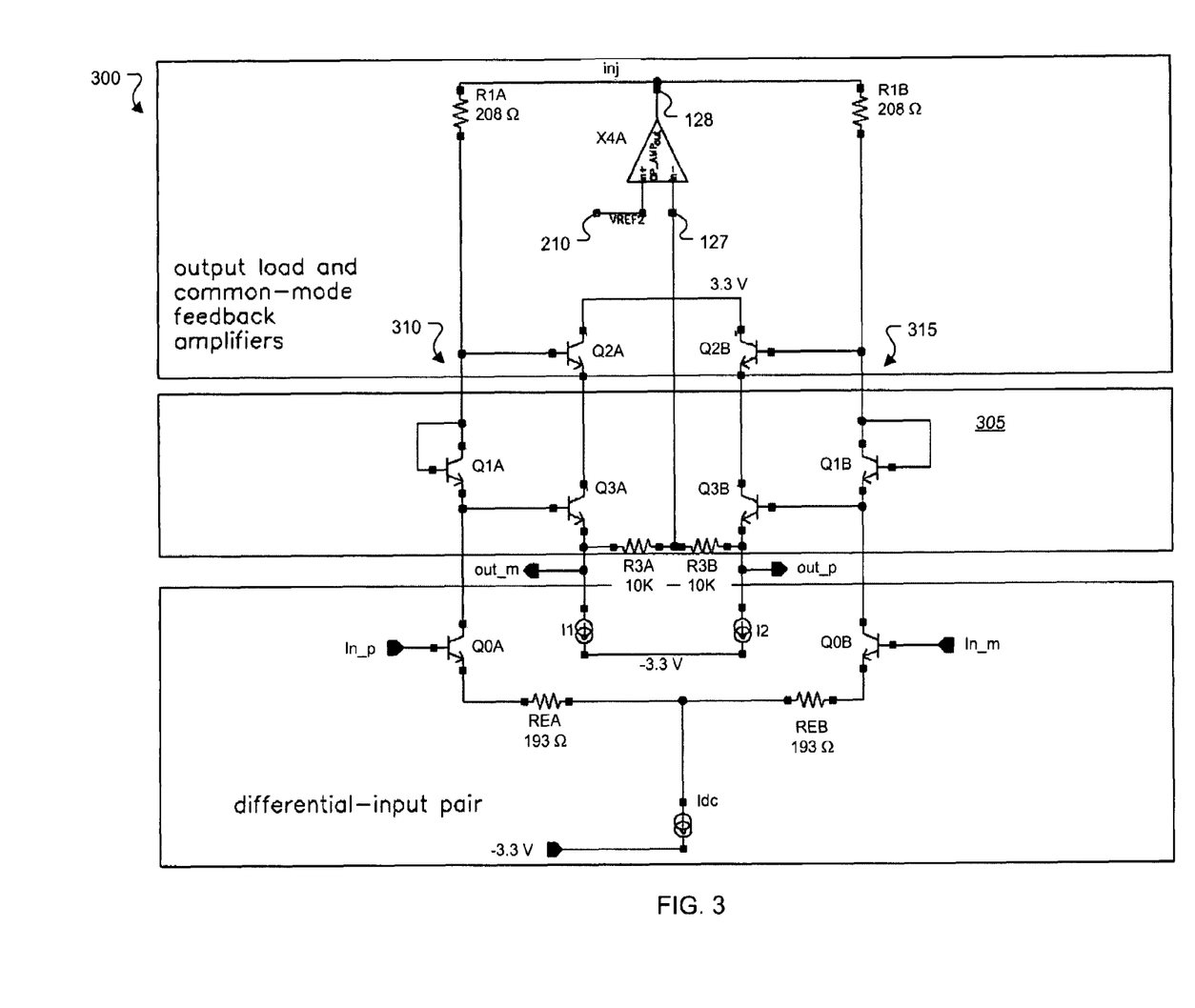

FIG. 3 shows a schematic of an exemplary circuit 300 implementing an embodiment of the differential amplifier 120 and the CMFB circuit 125. The circuit 300 includes an emitter follower output stage 305 with emitter followers Q3A, Q3B, and bootstrap circuits 310, 315 in each differential branch.

The bootstrap circuit 310 includes transistors Q1A and Q2A, and the bootstrap circuit 315 includes transistors Q1B and Q2B. The bootstrap circuits 310, 315 bootstrap the emitter followers Q3A, Q3B to substantially reduce or mitigate thermal tail effects in the emitter followers Q3A, Q3B.

In this embodiment, the common mode resistors R3A, R3B form a common mode node between the emitters of Q3A, Q3B in the emitter follower circuit 305. Compared to the embodiment described with reference to FIG. 2, the common mode node may be formed at offset of about a base-emitter voltage drop below the collector voltage of the transistors Q0A, Q0B.

By controlling the common-mode output voltage at an appropriately selected reference voltage VREF2, the CMFB circuit 125 can substantially regulate the common mode voltage of the collector voltages of Q0A and Q0B to substantially maintain a constant power operating condition, and thereby to substantially reduce or mitigate thermal tail effects in the differential amplifier 120.

In FIGS. 2-3, the supply voltage node inj is depicted as being directly connected to the output of the operational amplifier X4A. In various embodiments, the operational amplifier X4A may be implemented as integrated circuit elements on the same die as the differential circuit 120, but it may also be implemented, in whole or in part, off-die, on a different die in the same package, and/or external to a package containing an embodiment of the differential circuit 120.

Figure 4:
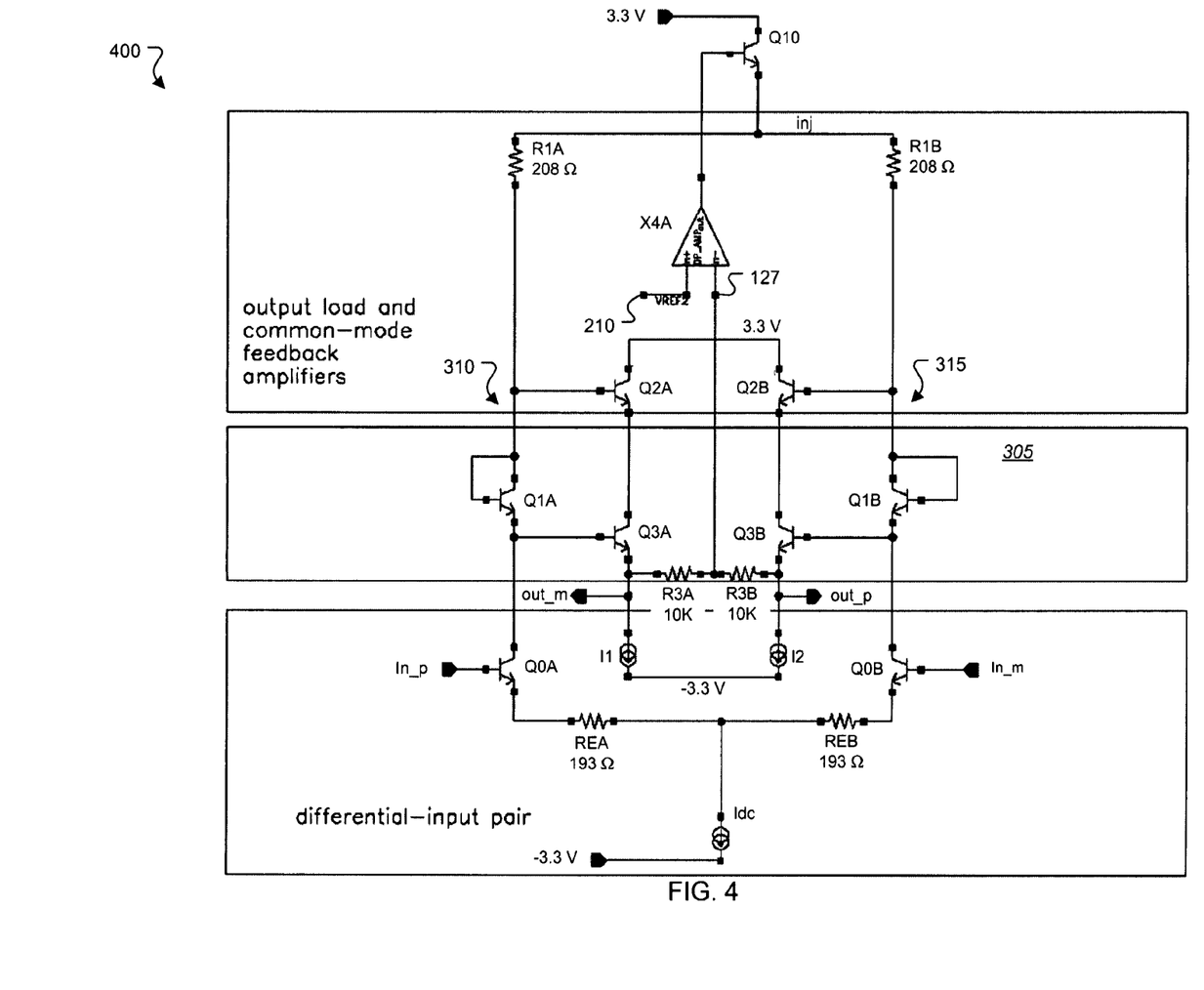

FIG. 4 shows an exemplary implementation 400 of the CMFB circuit 125 for mitigating thermal tail effects in a differential circuit. In the implementation 400, the operational amplifier X4A controls the base voltage of a transistor Q10, which is configured as an emitter follower. A collector of Q10 is connected to a positive power supply vp3p3 (+3.3V). An emitter of Q10 is connected to the voltage supply node inj that connects to the resistors R1A, R1B.

In this implementation, the operational amplifier X4A still operates to control the supply voltage node so that the common mode voltage at the common mode node 127 is substantially equal to the voltage on the VREF node 210. However the operational amplifier X4A is relieved from directly supplying the current Idc. The current Idc is supplied through the transistor Q10.

In various embodiments, the transistor Q10 may be implemented on the same or different die as the operational amplifier X4A or the transistors Q0A, Q0B. The transistor Q10 may be implemented as one or more transistors in parallel. In some embodiments, the transistor Q10 may be implemented as at least one discrete or integrated circuit component external (e.g., off-chip) to the package containing the transistors Q0A, Q0B. In some embodiments, the transistor Q10 may be implemented as PNP BJTs, a source follower MOSFET (metal oxide semiconductor field effect transistor) or JFET, for example.

Figure 5:
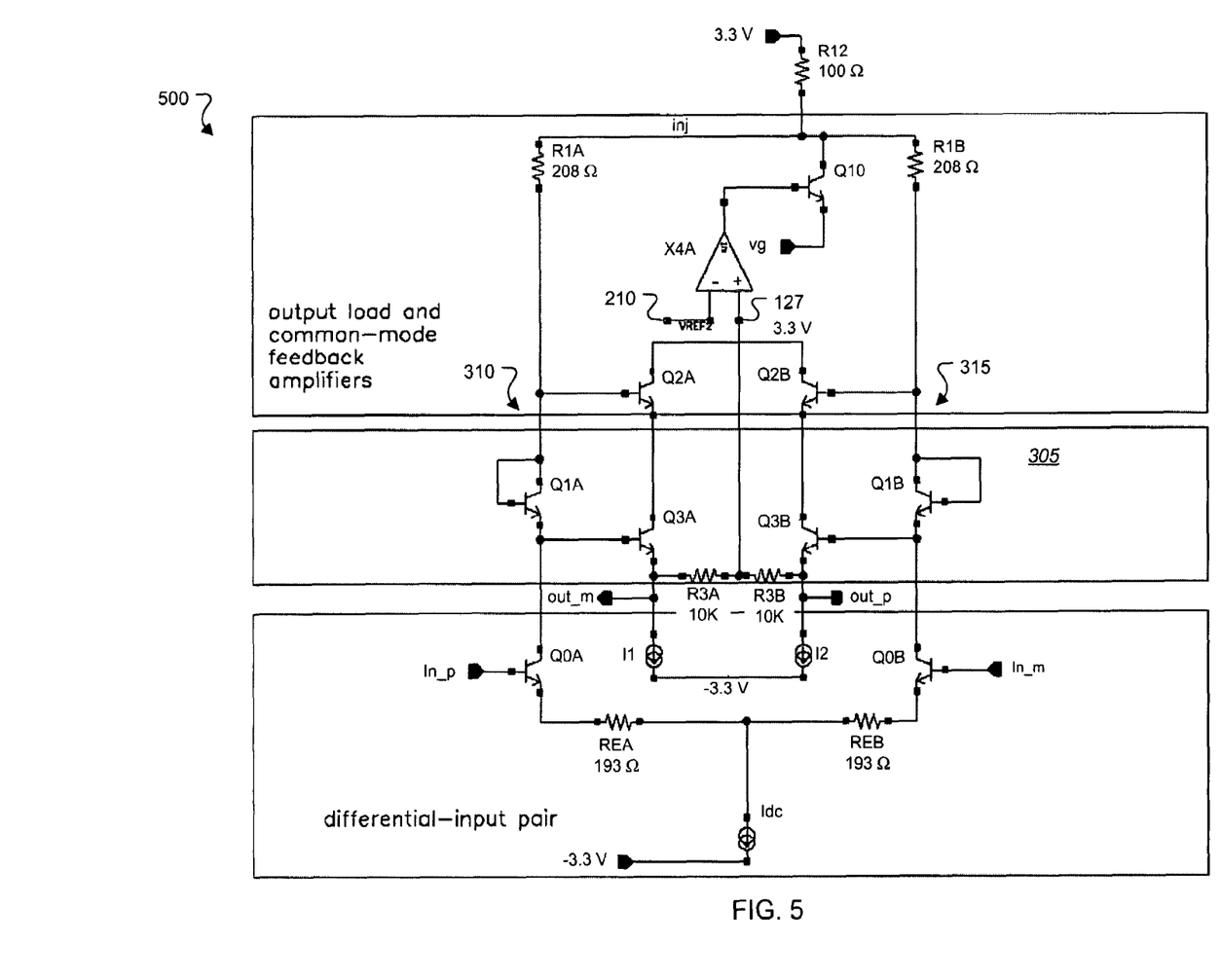

FIG. 5 shows another exemplary implementation 500 of the CMFB circuit 125 in which power dissipation is spread between a resistor R12 and the transistor Q10 configured as a shunt-regulator. In this example, the operational amplifier X4A controls the base of Q10 to regulate the voltage on the voltage supply node inj. The voltage on the voltage supply node inj is provided to the power supply vp3p3 (+3.3V) through the pull-up resistor R12. To account for the change in polarity introduced by the shunt regulator configuration, the common mode node 127 is connected to the non-inverting input, and the VREF node 210 is connected to the inverting input.

In this implementation, the operational amplifier X4A still operates to control the supply voltage node inj so that the common mode voltage at the common mode node 127 is substantially equal to the voltage on the VREF node 210. However the transistor Q10 does not directly supplying the current Idc, the voltage supply node can be pulled up through a relatively small resistance value of the resistor R12.

Figure 6:
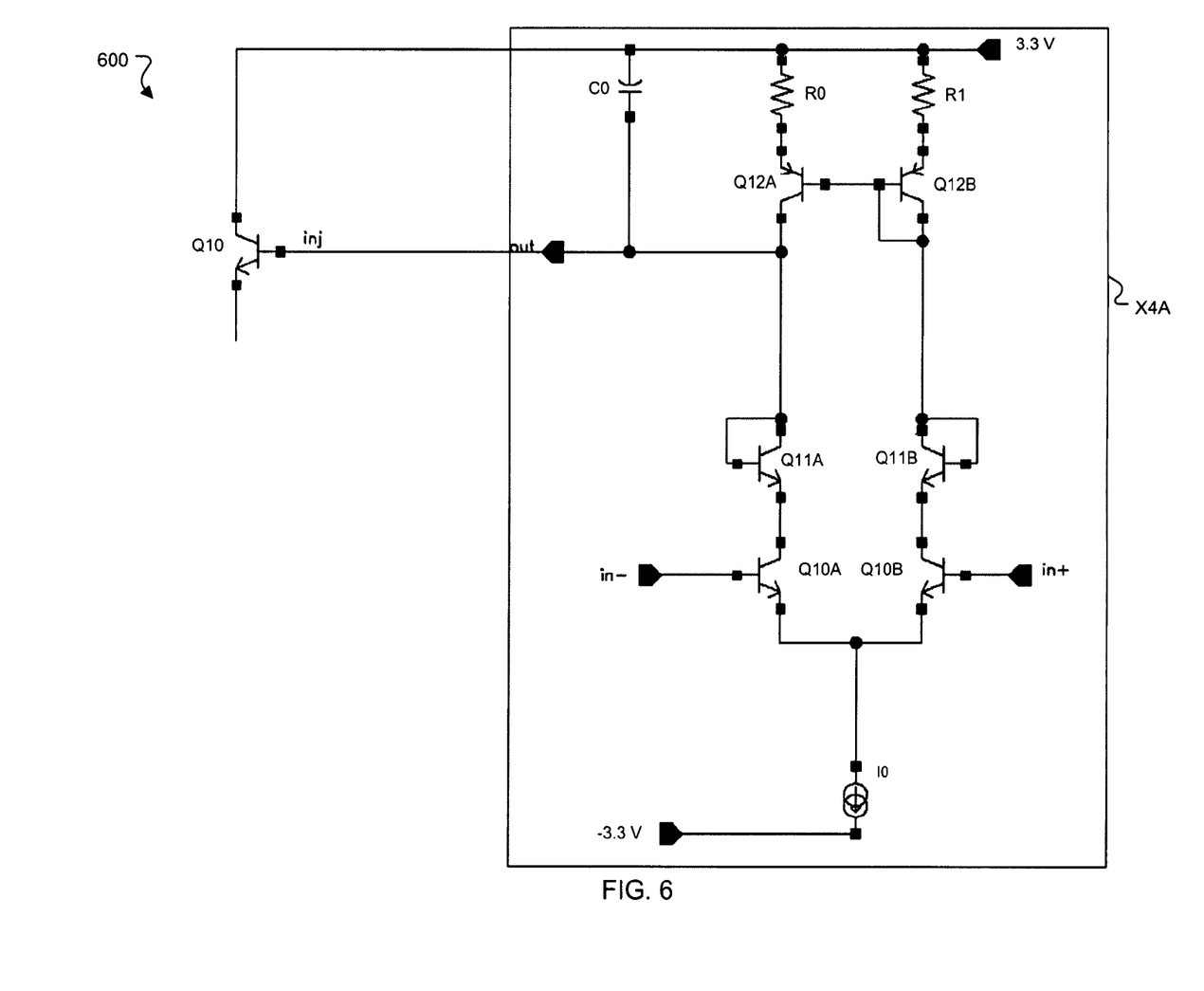
FIGS. 6-7 illustrate schematics for exemplary amplifiers for use in common mode voltage regulation.

FIG. 6 shows an exemplary realization 600 of the amplifier X4A. As shown, the amplifier X4A is driving the transistor Q10. In this example, the amplifier X4A uses active loads, Q12A, Q12B, to ensure high DC gain to reduce steady state errors. In other embodiments, passive loads, such as resistors, may be used.

In certain embodiments in which the differential circuit is implemented in an integrated circuit, the exemplary implementations 400, 500 are limited to controlling the supply voltage node inj up to a maximum of the internally available voltage vp3p3 (+3.3V). In some integrated circuit implementation, for example, vp3p3 (+3.3V) may be the highest voltage available in the package. Voltage headroom may be further limited by various internal biasing and/or control circuits, for example.

Figure 7:
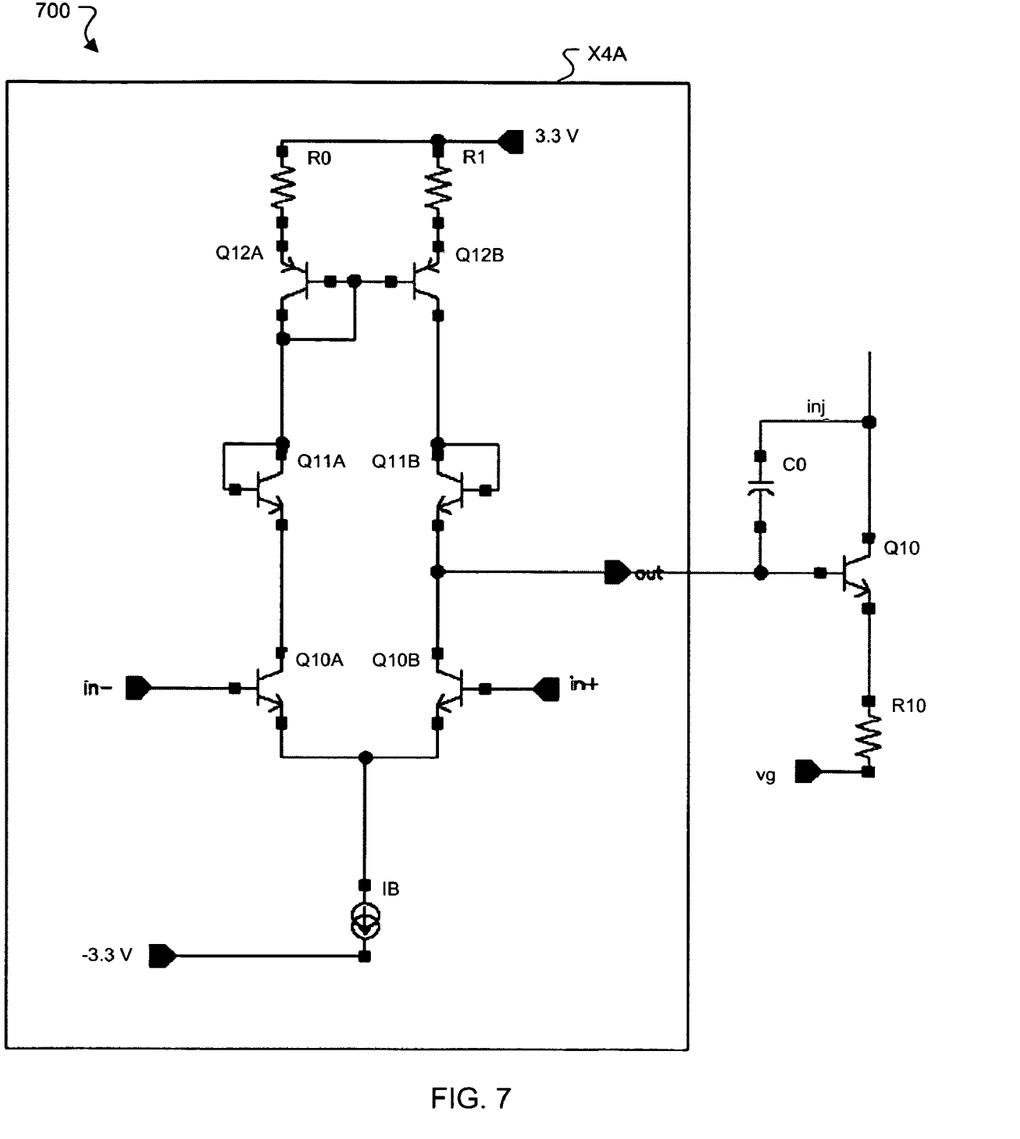

FIG. 7 shows an exemplary realization 700 of the amplifier X4A in which the supply voltage node inj is not limited to the internally available voltage (e.g., vp3p3 (+3.3V)). As shown, the operational amplifier X4A drives the transistor Q10. The collector of the transistor Q10 may be connected to any desired voltage within the breakdown voltage rating of the transistors. Such voltages may be supplied by voltage sources that are higher than the internally available voltage sources (e.g., +3.3V). For a 3.3V integrated circuit, examples of voltages to which the collector of the transistor Q10 may be connected include, but are not limited to, about 3.5V, 3.75V, 4.0V, 4.25V, 4.50V, 4.75V, or about 5.0V, or in the range of about 3.3-5 volts, or higher if acceptable by the integrated circuits.

In the depicted example, the realization 700 also illustrates an exemplary compensation capacitor C0 and a current limiting resistor R10. In this example, the compensation capacitor C0 is external to the amplifier X4A to obtain performance benefits by selecting a bandwidth of the amplifier. In various implementations, bandwidth may be selected, for example, to stabilize an operating point so as to substantially reduce thermal tail effects.

Although an exemplary system 100 has been described with reference to FIG. 1, other implementations may be deployed in other industrial, scientific, medical, commercial, and/or residential applications.

Although one implementation of the differential amplifier 120 and the CMFB circuit 125 is provided in the oscilloscope 100 with reference to FIG. 1. The CMFB circuit 125 may be deployed in other applications that employs differential amplifier 120. For example, the CMFB circuit 125 may be used in electrical circuits that uses buffers, test circuits having differential amplifiers, low voltage differential signaling (LVDS) systems, or other differential signaling circuits.

In some embodiments, the CMFB circuit 125 may be implemented to compensate for drift of operating condition within a frequency range, or below a certain frequency. In some applications, thermal tail time constants may be on the order of about one microsecond to about at least several milliseconds, for example. In such applications, the CMFB circuit 125 may be implemented to compensate thermal tail effects within a frequency range that may be on the order of about DC up to at least about 10 MHz. Other implementations of the CMFB circuit 125 may be used to compensate for drift of operating conditions in other frequency ranges.

In various examples, the input signal 105 may be received as a radio frequency signal at an antenna, or converted from a laser signal that is transmitted using optical fiber. In various embodiments, the input signal may be single-ended or differential. For example, the input signal may be a digital differential signal.

Embodiments may be applied in oscilloscopes including, but not limited to, sampling oscilloscopes, digital storage oscilloscopes, real time oscilloscopes, near real time oscilloscopes, and analog oscilloscopes, for example. Acquisition techniques may involve various synchronous, single shot, and/or asynchronous sampling techniques including, but not limited to, sequential sampling, random interleaved sampling, or coherent interleaved sampling, for example.

In some embodiments, the circuits may be implemented as integrated components on a common substrate, common die, or common package in an integrated circuit (e.g., on a chip). In other embodiments, some or all of the feedback circuit, for example, may be implemented off-chip, either in the same package or external to the package. Externally implemented components may be integrated, discrete, or a combination thereof. In some embodiments, one or more signals, such as control and/or supply voltage signals, may be supplied to the feedback circuit from off-chip.

Although exemplary implementations are given by using NPN bipolar junction transistors (BJTs) in a differential amplifier circuit, with proper rearrangement of the electronic components, other implementations are possible. For example, PNP BJTs, or other appropriate components can also be used. Transistors may be fabricated using various semiconductor materials, which may include, but are not limited to, Si, GaAs, Ge, and SiGe, for example. In a further example, various embodiments may be transformed into a dual circuit that includes a differential amplifier circuit with PNP input transistors that may operate from a negative supply voltage.

The amplifying circuit 120 may be a voltage amplifier, current amplifier, or other amplifiers with a fixed or variable gain. Although one exemplary embodiment is described with one differential stage, the differential amplifier circuit 120 may include more than one differential circuit. In some embodiments, the circuit 120 may amplify and/or buffer the input signal. The amplifying circuit 120 may also shift the level (e.g., current level, voltage level, etc.) of the input signal. In some embodiments, the circuit 120 may provide common-mode rejection.

The circuit 120 may be followed by an emitter follower circuit (not shown), for example, that buffers and/or level shifts the signal. In some examples, the sampling circuit 130 stores the continuous level applied from the output of the emitter follower circuit. The circuit 120 and the emitter follower circuit may combine to perform various signal conditioning functions, for example, to improve accuracy and reduce noise. For example, the amplifying circuit 120 and the emitter follower circuit may amplify the input signals to measurable levels and provide a desired input impedance characteristic at the input module 115.

In various embodiments, frequency response properties of the CMFB circuit 125 may vary. For example, the CMFB circuit 125 may be designed to substantially compensate for thermal tail effects in frequency ranges such as about 1 kHz-100 MHz, 5 KHz-50 MHz, 100 kHz-25 Mhz, or 200 kHz-10 MHz or below a certain frequency. The frequency response of the CMFB circuit 125 may be specified according to the frequency content of the application. For example, in an oversampled audio application, the operating frequency range of the CMFB circuit 125 may be 100 Hz-500 kHz or below 500 kHz. In other illustrative examples, communications applications (e.g., Ethernet, broadcast) may use frequencies such as between about 100 kHz-50 MHz or below 100 kHz, and switching power supply applications frequencies may use frequencies such as between about 5 kHz-5 MHz or below 5 kHz.

In some embodiments, a user of the digital oscilloscope 100 may selectively disable the CMFB circuit 125 using the UI 175. For certain measurements, the user may elect to temporarily switch off common mode voltage regulation by making an input with a button (e.g., using a soft menu, touch screen, keyboard, or keypad) on the UI 175.

In some embodiments, VREF may be adjustable to permit fine tuning of the operating point of the differential amplifier 120 so as to minimize thermal tails. For example, tests could be run at manufacture time or when the processor 140 executes a maintenance program to characterize the thermal tail response of the differential circuit 120. Then, a voltage reference may be trimmed (e.g., by laser trimming, digital potentiometer, selective resistor population, controlled output of a digital-to-analog converter, etc.) to set the VREF at a preferred voltage to improve signal performance. For example, the VREF could be tried at incremental values (e.g., using a golden section search, exhaustive search, etc.) within a range of voltages to identify an optimal value.

In one implementation, thermal tail effects in the differential amplifier 120 can be measured when amplifying one or more predefined test input signals. The VREF could be adjusted to a value determined to regulate to an operating point that is close to the constant power operating point to minimize thermal tail effects. The identified value for VREF can be stored in a NVM 160, and loaded into a digital-to-analog converter to provide the identified reference voltage to the CMFB circuit 125.

Some embodiments may operate with alternating current (AC) voltage sources. For example, AC input signals at between about 47 Hz and about 550 Hz be provided from an electric utility source or local electric generator. Such AC input signals may be received at a 50/60 Hz power port (not shown) via an AC-to-DC rectification stage. Provision for AC (e.g., sine wave, square wave, triangular wave, etc . . . ) inputs may include a line frequency transformer to provide voltage step-up, voltage step-down, and/or isolation.

Operating power may also be received, for example, from primary and/or secondary batteries, which may provide uninterruptible power and/or facilitate portable or remote applications. Power supplied to digital and analog processing circuits may be scaled in voltage by one or more DC-to-DC converters and/or linear regulators.

In various embodiments, other elements than those in the depicted examples may be used to sense a common mode voltage, receive a reference or set point signal, determine an error signal, amplify the error signal, and provide a corrective signal to substantially compensate for thermal tail effects. For example, some or all of these operations may be performed or enhanced by a controller, which may include elements such as, for example, discrete asynchronous or synchronous logic, a processor executing instructions, analog circuitry, or a combination of such elements. For example, a voltage may be sensed by an analog-to-digital converter, which converts the voltage to a value that may be read by a processor. After comparing the value to a reference value and amplifying the difference, the processor may command a digital to analog converter generate a corrective signal. In another implementation, the programmed processor may adjust a voltage reference supplied to a common mode feedback amplifier.

Although an example of a system, which may be portable, has been described with reference to the above figures, other implementations may be deployed in other processing applications, such as desktop and/or networked environments.

Although described in the context of the digital oscilloscope 100, some embodiments may use common mode feedback regulation as described herein in certain other equipment that employs differential amplifiers. For example, and not intended as limiting, some embodiments may be applied in analog oscilloscopes, audio systems, test and measurement equipment, or various other industrial, scientific, and/or medical applications.

Although particular features of an architecture have been described, other features may be incorporated to improve performance. For example, caching (e.g., L1, L2, etc . . . ) techniques may be used. Random access memory may be included, for example, to provide scratch pad memory and or to load executable code or parameter information stored for use during runtime operations. Other hardware and software may be provided to perform operations, such as network or other communications using one or more protocols, wireless (e.g., infrared) communications, stored operational energy and power supplies (e.g., batteries), switching and/or linear power supply circuits, software maintenance (e.g., self-test, upgrades). One or more communication interfaces may be provided in support of data storage and related operations.

Some systems may be implemented as a computer system that can be used with implementations of the invention. For example, various implementations may include digital and/or analog circuitry, computer hardware, firmware, software, or combinations thereof. Apparatus can be implemented in a computer program product tangibly embodied in an information carrier, e.g., in a machine-readable storage device or in a propagated signal, for execution by a programmable processor; and methods can be performed by a programmable processor executing a program of instructions to perform functions of the invention by operating on input data and generating an output. The invention can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits).

In some implementations, each system 100 may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. The invention may be implemented in a computer system that includes a graphical user interface and/or an Internet browser. To provide for interaction with a user, some implementations may be implemented on a computer having a display device, such as a CRT (cathode ray tube) or LCD (liquid crystal display) monitor for displaying information to the user, a keyboard, and a pointing device, such as a mouse or a trackball by which the user can provide input to the computer.

In various implementations, the system 100 may communicate using suitable communication methods, equipment, and techniques. For example, the system 100 may communicate with compatible devices (e.g., devices capable of transferring data to and/or from the system 100) using point-to-point communication in which a message is transported directly from the source to the receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11 a/b/g, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations of the invention have been described. Nevertheless, it will be understood that various modifications may be made without departing from the spirit and scope of the invention. For example, advantageous results may be achieved if the steps of the disclosed techniques were performed in a different sequence, if components in the disclosed systems were combined in a different manner, or if the components were replaced or supplemented by other components. The functions and processes (including algorithms) may be performed in hardware, software, or a combination thereof, and some implementations may be performed on modules or hardware not identical to those described. Accordingly, other implementations are within the scope of the following claims.

What is claimed is:

1. A waveform processing system comprising:
a channel to receive an input signal; and
a converter coupled to the channel to convert the input signal to a digital representation, wherein the converter comprises:
 a differential circuit, comprising a differential amplifier, to condition the input signal, the differential circuit comprising a pair of transistors biased by the input signal and a differential emitter follower circuit coupled to a differential signal output of the differential circuit;
 a controller to maintain a common mode voltage in the differential circuit by controlling a supply voltage that is supplied to the differential circuit such that at least one of the transistors dissipates power at a substantially constant level; and
 a common mode voltage sensor to detect a common mode voltage that represents the common mode voltage that is maintained by the controller.

2. The system of claim 1, wherein the differential circuit is configured to have a nominal operating point at which at least one of the transistors dissipates power at a substantially constant level.

3. The system of claim 1, wherein the common mode voltage detected by the common mode voltage sensor is in the differential emitter follower circuit and offset from the common mode voltage that is maintained by the controller.

4. The system of claim 1, further comprising a voltage reference source to provide a reference voltage that the controller compares to a detected common mode voltage.

5. The system of claim 1, wherein the controller controls a controlled element configured to supply the supply voltage from a voltage source.

6. The system of claim 5, wherein the controlled element comprises a transistor in an emitter follower configuration.

7. The system of claim 5, wherein the controlled element comprises a transistor in a shunt-regulator configuration.

8. The system of claim 5, wherein the voltage source comprises an off-chip voltage source.

9. The system of claim 5, wherein the voltage source has a voltage with less than about 15% voltage ripple.

10. The system of claim 1, wherein the controller maintains a substantially constant common mode voltage at ambient temperatures between about −40 and about 150 degrees Celsius.

11. The system of claim 1, wherein the controller maintains a substantially constant common mode voltage at ambient temperatures between about 0 and about 100 degrees Celsius.

12. The system of claim 1, further comprising a digital oscilloscope that includes the channel and the converter.

13. A method of processing signals in a waveform processor, the method comprising:
receiving an input signal;
conditioning the input signal with a differential amplifier circuit comprising a pair of transistors and a differential emitter follower circuit coupled to a different signal output of the differential amplifier circuit;
biasing the transistors with the input signal;
monitoring a common mode voltage in the differential circuit; and
controlling a supply voltage supplied to the differential circuit by comparing the monitored common mode voltage to a reference voltage to maintain the monitored common mode voltage such that at least one of the transistors dissipates power at a substantially constant level.

14. The method of claim 13, wherein controlling the supply voltage comprises maintaining the monitored common mode voltage at a substantially constant level at ambient temperatures between about 0 and about 100 degrees Celsius.

15. The method of claim 13, wherein the controlling step comprises biasing at least one transistor selected from the group consisting of a NPN bipolar junction transistor, a PNP bipolar junction transistor, a metal oxide semiconductor field effect transistor, and a junction field effect transistor.

16. A waveform processor comprising:
an input to receive an input signal; and
a converter coupled to the input to convert the input signal to a digital representation, wherein the converter comprises:
 a differential circuit, comprising a differential amplifier, to condition the input signal, the differential circuit comprising a pair of transistors biased by the input signal and supplied by a supply voltage and a differential emitter follower circuit coupled to a differential signal output of the differential circuit; and
 means for controlling the supply voltage by comparing the monitored common mode voltage to a reference voltage to maintain a common mode voltage in the differential circuit such that at least one of the transistors dissipates power at a substantially constant level.

17. The waveform processor of claim 16, further comprising means for detecting the common mode voltage in the differential circuit.

* * * * *